US011715688B2

(12) United States Patent
Patil et al.

(10) Patent No.: US 11,715,688 B2
(45) Date of Patent: Aug. 1, 2023

(54) VARIABLE DIELECTRIC CONSTANT MATERIALS IN SAME LAYER OF A PACKAGE

(71) Applicant: QUALCOMM Incorporated, San Diego, CA (US)

(72) Inventors: Aniket Patil, San Diego, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/883,829

(22) Filed: May 26, 2020

(65) Prior Publication Data
US 2021/0375743 A1 Dec. 2, 2021

(51) Int. Cl.
H01L 21/768 (2006.01)
H01L 23/528 (2006.01)
H01L 25/065 (2023.01)
H01L 23/00 (2006.01)
H01L 23/522 (2006.01)
H01L 23/532 (2006.01)
H01L 21/762 (2006.01)
H01L 29/06 (2006.01)

(52) U.S. Cl.
CPC .......... H01L 23/528 (2013.01); H01L 21/762 (2013.01); H01L 21/76802 (2013.01); H01L 23/5226 (2013.01); H01L 23/5329 (2013.01); H01L 24/14 (2013.01); H01L 24/95 (2013.01); H01L 25/0657 (2013.01); H01L 29/0649 (2013.01); H01L 21/76835 (2013.01); H05K 2201/0187 (2013.01)

(58) Field of Classification Search
CPC ...... H05K 2201/0187; H01L 21/76835; H01L 23/5329–53295; H01L 21/76801–76802; H01L 21/76829–76837
See application file for complete search history.

(56) References Cited

U.S. PATENT DOCUMENTS

| 2004/0259317 A1* | 12/2004 | Ding | H05K 1/162 |
| | | | 438/618 |
| 2006/0087029 A1* | 4/2006 | Imanaka | H01L 23/49822 |
| | | | 257/723 |
| 2006/0151863 A1* | 7/2006 | Das | H05K 1/162 |
| | | | 257/678 |
| 2008/0289866 A1* | 11/2008 | Yuri | H01L 23/49822 |
| | | | 174/260 |
| 2009/0160020 A1* | 6/2009 | Barth | G06F 30/39 |
| | | | 257/532 |
| 2014/0356635 A1* | 12/2014 | Kim | H01L 23/49822 |
| | | | 428/433 |

(Continued)

Primary Examiner — Phat X Cao
Assistant Examiner — William Henry Anderson
(74) Attorney, Agent, or Firm — Seyfarth Shaw LLP

(57) ABSTRACT

A package substrate has a dielectric layer and a redistribution metal layer. The dielectric layer has a first dielectric material and a second dielectric material. The first dielectric material is different than the second dielectric material. The second dielectric material may have a dielectric constant that is either greater than or less than the dielectric constant of the first dielectric material. The second dielectric may be selected based on a specific target application such as single-ended signal routing or serializer/deserializer (SERDES) routing.

20 Claims, 11 Drawing Sheets

(56) References Cited

U.S. PATENT DOCUMENTS

| | | | |
|---|---|---|---|
| 2016/0095208 A1* | 3/2016 | Kim | C23F 1/02 |
| | | | 216/13 |
| 2016/0372544 A1* | 12/2016 | Yang | H01L 23/528 |
| 2017/0040265 A1* | 2/2017 | Park | H01L 25/105 |

* cited by examiner

| | ILLUSTRATION OF DEVICE | METHOD |
|---|---|---|
| 502 | 550 | Include First Carrier |
| 504 | 552, 550 | Apply Temporary Bonding Film Coat |
| 506 | 454, 452, 552, 550 | Place Die on Temporary Bonding Film Active Side Down |
| 508 | 454, 556, 452, 552, 550 | Encapsulate the Die |
| 510 | 454, 556, 452, 552, 550 | Backgrind Encapsulation Material (e.g., Mold) to Desired Height |

*FIG. 5A*

| | ILLUSTRATION OF DEVICE | METHOD |
|---|---|---|
| 512 |  | Attach a Second Carrier, Remove First Carrier, and Flip Assembly |
| 514 |  | Apply Photoimageable Dielectric (PID) Coat / Lamination |
| 516 |  | Expose/ Develop/ Cure (Litho)(opening) + Pre-treatment for Adhesion |
| 518 |  | Apply Second Dielectric Fill by Screen Printing |

| | ILLUSTRATION OF DEVICE | METHOD |
|---|---|---|
| 520 |  | Build up Redistribution Layer (RDL): Passivation Material (PM) expose + develop + seed deposit +RDL (Litho + Plate + strip + etch) |
| 522 |  | Repeat Blocks 514-520 To Add Additional RDL Build Up With Multiple Dielectrics, Form Under Bump Metalization (UBM) Layer And Attach Ball Or Package Pins |
| 524 |  | Remove Second Carrier and package Singulation | even
VARIABLE DIELECTRIC CONSTANT MATERIALS IN SAME LAYER OF A PACKAGE

TECHNICAL FIELD

The present disclosure generally relates to semiconductor devices. More specifically, the present disclosure relates to an integrated circuit package having multiple different dielectric materials in a same package dielectric layer.

BACKGROUND

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile applications demand a small form factor, low cost, a tight power budget, and high electrical performance. Package design has evolved to meet these divergent goals for enabling mobile applications that support multimedia enhancements. Some components of an integrated circuit package may use higher dielectric constant material while others may use lower dielectric constant material. That is, depending on the particular application, a higher dielectric constant material or lower dielectric constant material may significantly impact performance. For instance, higher dielectric constant material may enhance performance in single-ended routing applications such as double data rate (DDR) signaling. On the other hand, lower dielectric constant materials may provide enhanced performance for serializer/deserializer (SERDES) routing such as universal serial bus (USB), or peripheral component interconnect express (PCIe) signaling.

Lower dielectric constant material and higher dielectric constant material may be expensive compared to conventional midrange dielectric constant materials. Additionally, lower dielectric constant material and higher dielectric constant material may be less structurally stable. As such, using lower dielectric constant material or higher dielectric constant material exclusively in a package substrate area for larger packages/modules of application processors may result in devices that are less stable structurally and/or significantly increase costs.

SUMMARY

In an aspect of the present disclosure, a package substrate is provided. The package substrate has a dielectric layer including a first dielectric and a second dielectric. The first dielectric is different than the second dielectric.

In another aspect of the present disclosure, an integrated circuit device is provided. The integrated circuit device includes a die that has one or more logic elements on an active side of the die. The integrated circuit device also includes a package substrate coupled to the die. The package substrate has one or more dielectric layers that include a first dielectric and a second dielectric. The first dielectric is different than the second dielectric.

In yet another aspect of the present disclosure, a method of providing a device is disclosed. The method includes providing a die that has a logic element on an active side of the die. The method also includes forming a package substrate coupled to the active side of the die. The package substrate has a dielectric layer including a first dielectric and a second dielectric. The first dielectric is different than the second dielectric.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 5A-C are diagrams illustrating a process for forming an integrated circuit package such as the integrated circuit package of FIG. 4B, in accordance with aspects of the present disclosure.

DETAILED DESCRIPTION

Figure 1:
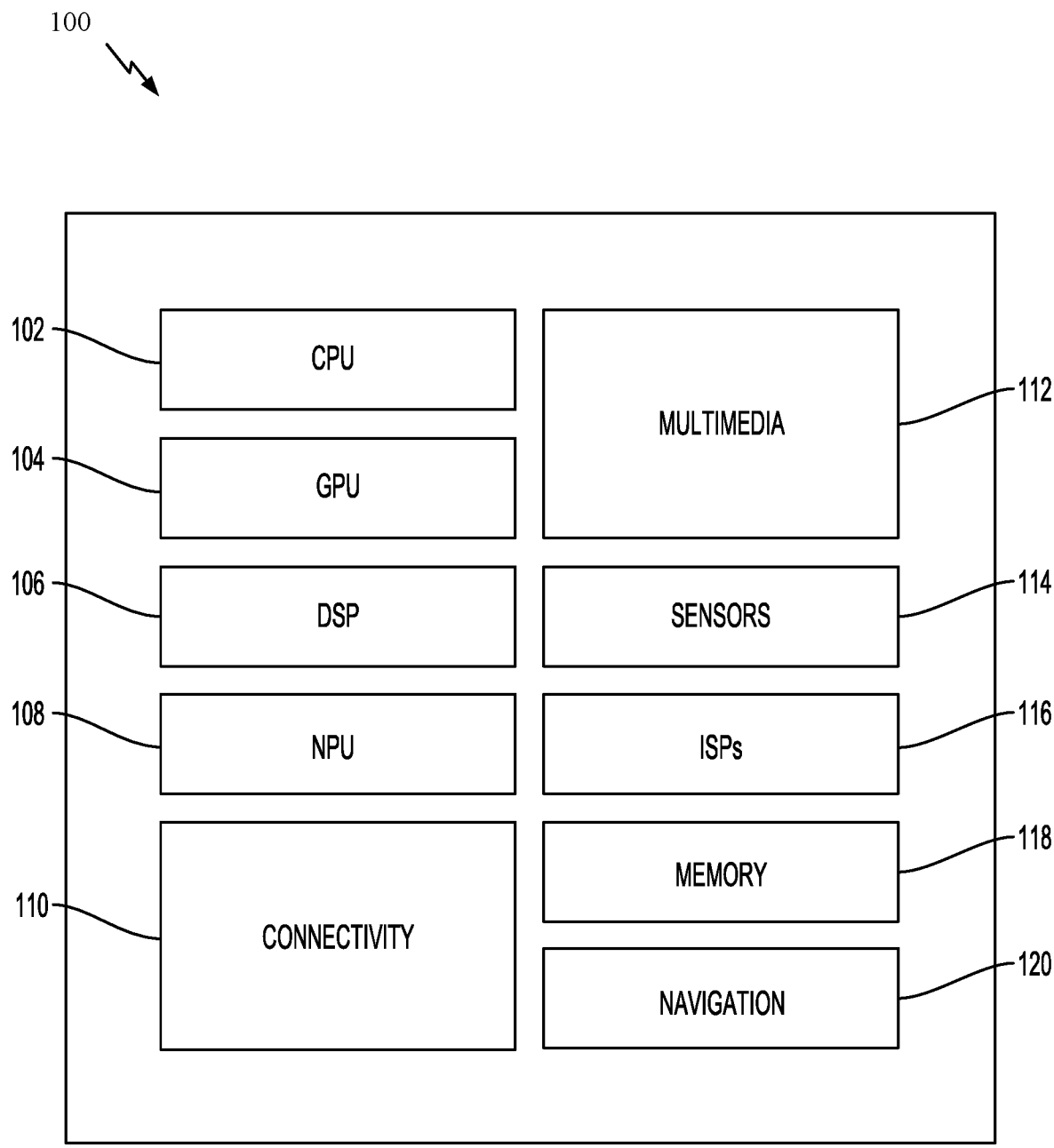
FIG. 1 illustrates an example implementation of a host system-on-a-chip (SoC), which includes a package substrate having a dielectric layer with multiple different dielectric materials, in accordance with aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. As further described, the term "laminate" may refer to a multilayer sheet to enable packaging of an integrated circuit (IC) device. The terms "substrate," "wafer," and "laminate" may be used interchangeably. Similarly, the terms "chip" and "die" may be used interchangeably.

State-of-the-art mobile applications demand a small form factor, low cost, a tight power budget, and high electrical performance. Package design has evolved to meet these divergent goals for enabling mobile applications that support multimedia enhancements. The costs for faster processors and increased computing power is ever increasing.

One factor in the cost of faster processors is the selection of materials used in fabricating the processors. Conventional package substrates utilize a single dielectric material throughout. The conventional dielectric has a midrange dielectric constant (e.g., material having a dielectric constant in the range between 3.3 and 3.7) for stability and cost considerations. However, conventional packaging substrates may significantly impact performance. This is because some components of an integrated circuit package may be better suited for higher dielectric constant material while others may match a lower dielectric constant material. That is, depending on the particular application, a higher dielectric constant material (e.g., material having a dielectric constant that is greater than 3.7) or lower dielectric constant material (e.g., material having a dielectric constant that is less than 3.3) may significantly impact performance. For instance, certain routing for high-speed interfaces may have electrical specifications for impedance and crosstalk. For these applications, using a material with a lower dielectric constant may reduce signal losses and thus improve performance. On the other hand, certain interfaces may have specifications for higher impedance. For such interfaces, materials with a higher dielectric constant may improve performance.

Although, the lower dielectric constant material and higher dielectric constant material may offer significant benefits from an electrical point of view, such materials may be substantially more expensive compared to conventional materials with midrange dielectric constants. Additionally, lower dielectric constant material and higher dielectric constant material may have no filler (e.g., ultrafine glass particles) or less filler than conventional materials with midrange dielectric constants and thus may be less stable structurally. Therefore, using such lower dielectric constant material or higher dielectric constant material exclusively throughout a package substrate for larger packages or modules of application processors may result in devices that are less stable structurally and/or may significantly increase costs. Accordingly, aspects of the present disclosure are directed to a package substrate that includes multiple different dielectrics in the same dielectric layer.

FIG. 1 illustrates an example implementation of a host system-on-a-chip (SoC) 100, which includes a package substrate with multiple different dielectric materials, in accordance with aspects of the present disclosure. The host SoC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SoC 100 includes various processing units that support multi-threaded operation. For the configuration shown in FIG. 1, the host SoC 100 includes a multi-core central processing unit (CPU) 102, a graphics processor unit (GPU) 104, a digital signal processor (DSP) 106, and a neural processor unit (NPU) 108. The host SoC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
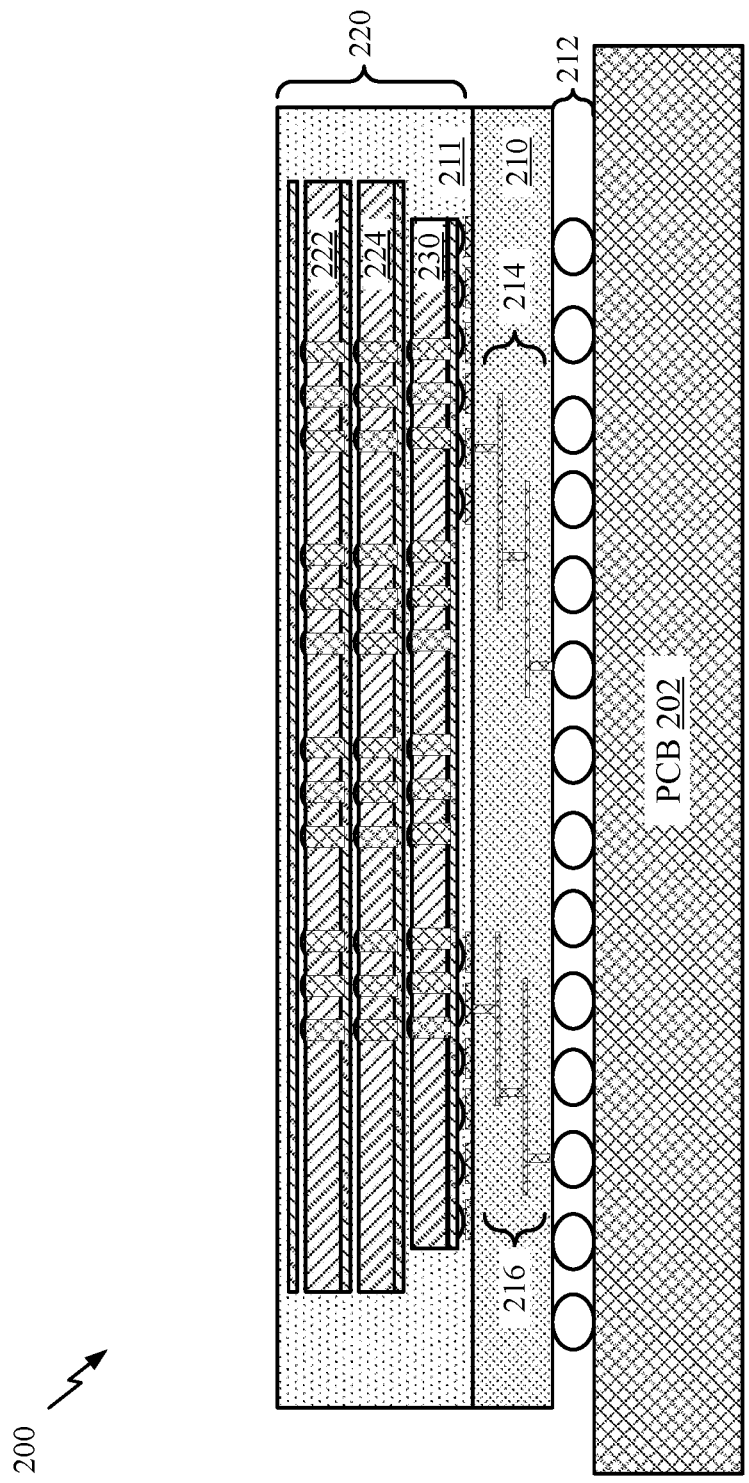
FIG. 2 shows a cross-sectional view illustrating a stacked integrated circuit (IC) package of the SoC of FIG. 1, in accordance with aspects of the present disclosure.

FIG. 2 shows a cross-sectional view illustrating a stacked integrated circuit (IC) package 200 of the SoC 100 of FIG. 1. Representatively, the stacked IC package 200 includes a printed circuit board (PCB) 202 connected to a package substrate 210 with interconnects 212. In this configuration, the package substrate 210 includes conductive layers 214 and 216. Above the package substrate 210 is a 3D chip stack 220, including stacked dies 222, 224, and 230, encapsulated by mold compound 211. In one aspect of the present disclosure, the die 230 is the SoC of FIG. 1.

Figure 3:
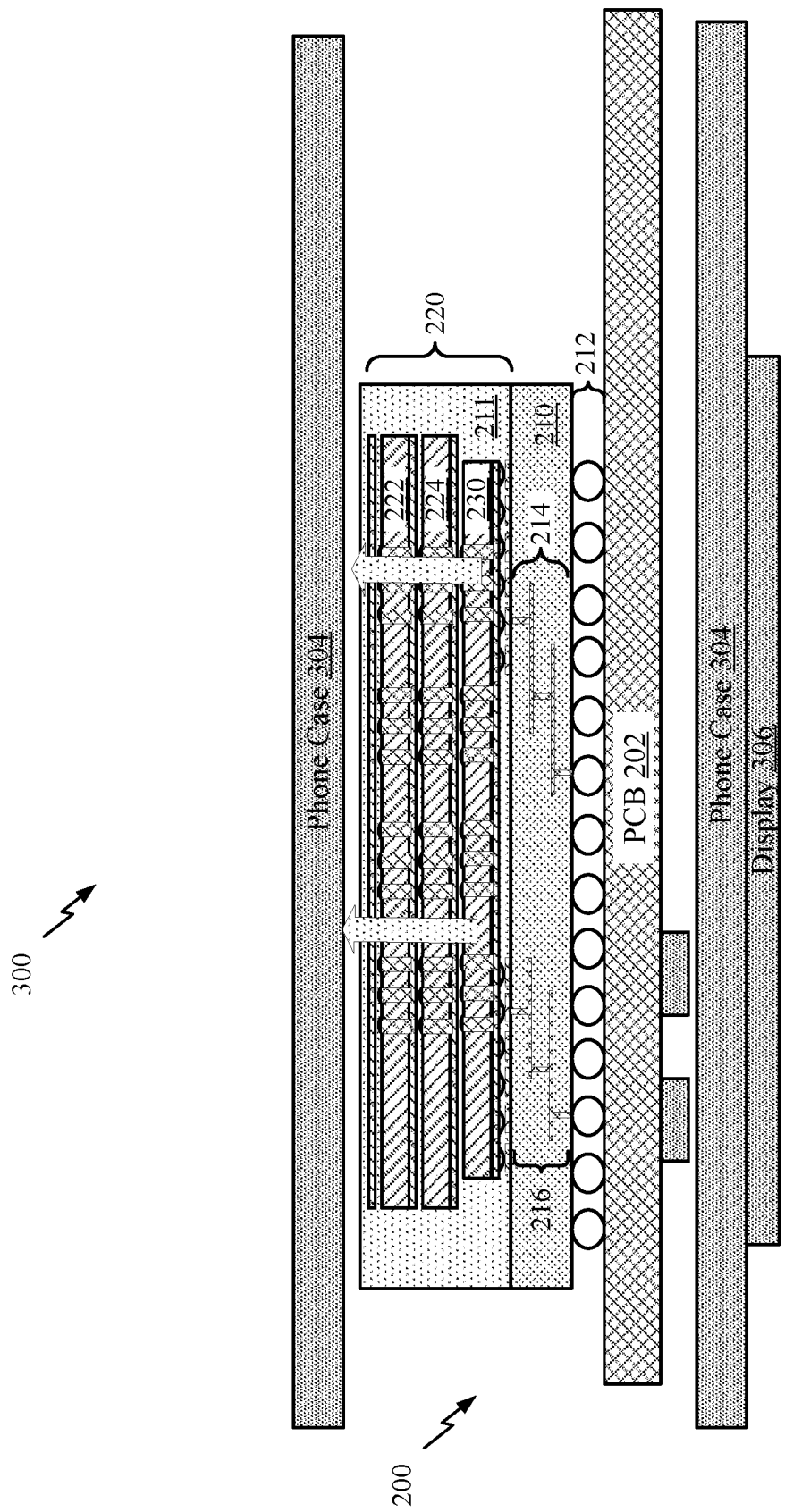
FIG. 3 shows a cross-sectional view illustrating the stacked IC package of FIG. 2, incorporated into a wireless device, according to one aspect of the present disclosure.

FIG. 3 shows a cross-sectional view illustrating the stacked IC package 200 of FIG. 2, incorporated into a wireless device 300, according to one aspect of the present disclosure. As described, the wireless device 300 may include, but is not limited to, a smartphone, tablet, handheld device, or other limited form factor device configured for 5G communications. Representatively, the stacked IC package 200 is arranged within a phone case 304, including a display 306. In this configuration, a package substrate with multiple different dielectrics is integrated into the stacked IC package 200, for example, as shown in FIGS. 4A and 4B.

Figure 4A:
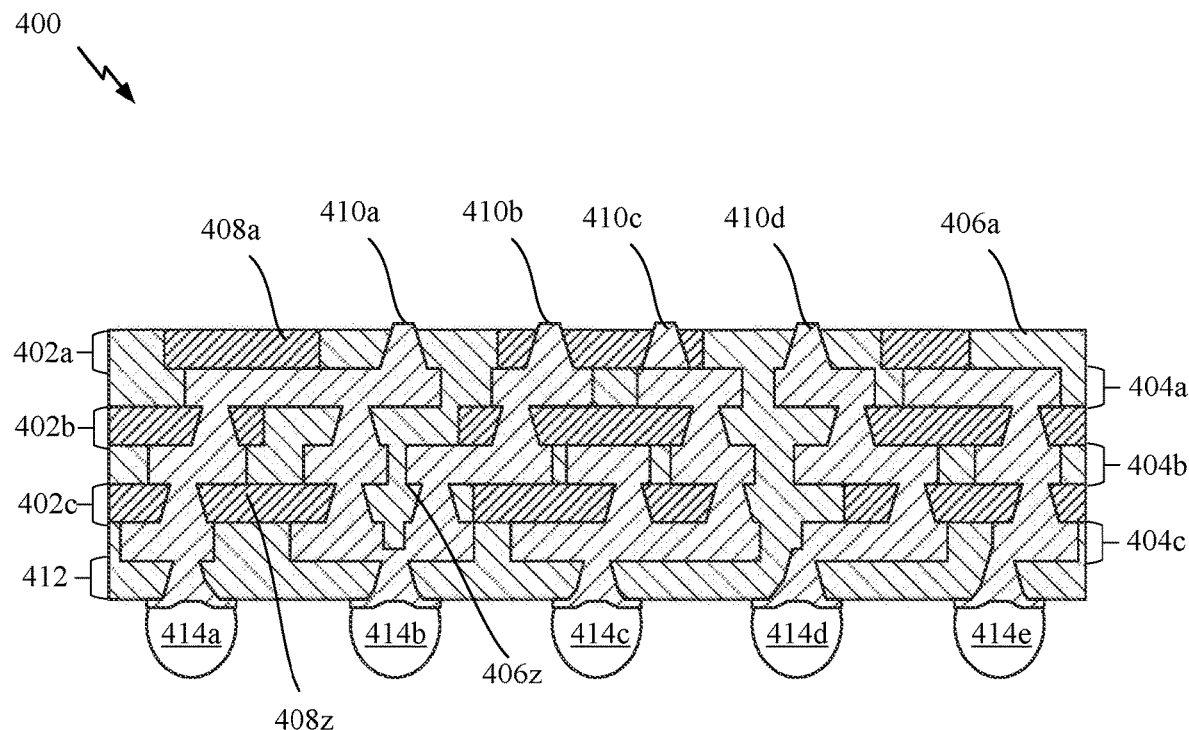
FIG. 4A is a block diagram illustrating a cross-sectional view of a package substrate, in accordance with aspects of the present disclosure.
Figure 4A:
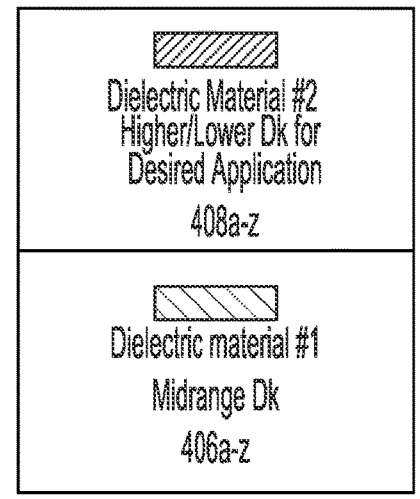
Figure 4B:
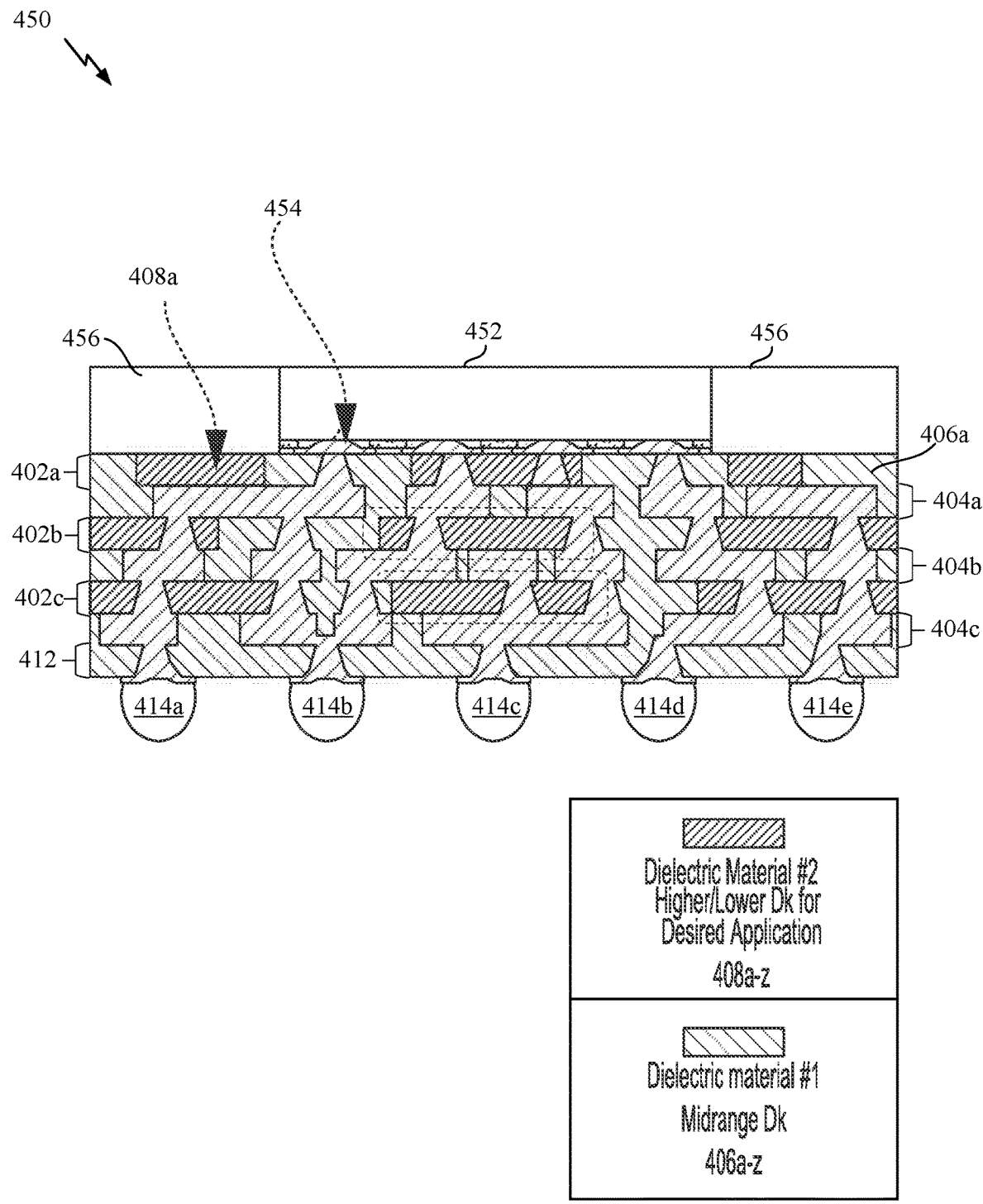
FIG. 4B is a block diagram illustrating a cross-sectional view of an integrated circuit package, in accordance with aspects of the present disclosure.

FIG. 4A is a block diagram illustrating a cross-sectional view of a package substrate 400, in accordance with aspects of the present disclosure. As shown in FIG. 4, the package substrate 400 includes dielectric layers 402*a-c* conductive, e.g., metal, layers 404*a-c,* and interconnections (e.g., vias 410*a-d*). The package substrate 400 may also include an under bump metallization layer 412 and package pins 414*a-e*. Although the package substrate 400 is shown with three dielectric (e.g., 402*a-c*) and three metal layers (e.g., 404*a-c*), the number of layers is merely exemplary and for ease of illustration. Any number of layers may be included in package substrate 400 according to design preferences, for instance. The dielectric layers (e.g., 402*a-c*) may be formed to include multiple different dielectric materials (e.g., with different dielectric constants). For example, the dielectric layer 402*a* includes a first dielectric material (e.g., dielectric material # 1, 406*a-z*) and a second dielectric material (e.g., dielectric material # 2, 408*a-z*). Although, each of the dielectric layers (e.g., 402*a-c*) in the example of FIG. 4A, include multiple different dielectric materials, the present disclosure is not so limiting. Rather, one or more of the dielectric layers may be formed with multiple different dielectric materials.

In some aspects, the first dielectric material (e.g., dielectric material # 1, 406*a-z*) may be a material having a mid-range dielectric constant (Dk) (e.g., (e.g., material having a dielectric constant between 3.3. and 3.7) which may include a filler (e.g., ultrafine glass particles). The second dielectric material (e.g., dielectric material # 2, 408*a-z*) may be a material having a higher Dk (e.g., material having a dielectric constant that is greater than 3.7) or a lower Dk (e.g., material having a dielectric constant that is less than 3.3) relative to the first dielectric material (e.g., dielectric material # 1, 406*a-z*). In some aspects, the second dielectric material (e.g., 408*a-z*) may be selected based on the desired application for an IC package including the package substrate 400. For instance, where the desired application is routing, the dielectric material # 2 (e.g., 408*a-z*) may be selected based on certain specifications or target metrics (e.g., specifications for crosstalk or signal loss). In one example, the second dielectric material (e.g., 408*a-z*) may be selected to have a lower Dk (e.g., material having a dielectric constant that is less than 3.7) than the first dielectric material (e.g., 406*a-z*) for single ended signaling applications (e.g., DDR signals) to reduce signal loss due to the package. On the other hand, where the application calls for higher impedance for a serializer/deserializer (SERDES) routing interface (e.g., USB or peripheral component interconnect express (PCIe)), second dielectric material (e.g., 408*a-z*) may be selected to have a higher Dk than the first dielectric material (e.g., 406*a-z*).

Still further benefits may be realized by virtue of the selection of the second dielectric material. In some aspects, the second dielectric material may be selected for design feature size reduction. For instance, the second dielectric material may be selected to reduce the buildup line/space. In one example, for a SERDES circuit, the line trace width may be reduced with a better dielectric material (e.g., higher dielectric constant) while maintaining electrical performance.

In another aspect, the second dielectric may be selected based on the cost savings. For example, where a less expensive dielectric material may provide substantially similar electrical and structural performance, the second dielectric may be selected accordingly to reduce the cost of the package substrate. Additionally, in some aspects, the second dielectric material may be selected to reduce warpage or flexibility of the package substrate.

FIG. 4B is a block diagram illustrating a cross-sectional view of an integrated circuit package 450, in accordance with aspects of the present disclosure. As shown in FIG. 4B, the integrated circuit package 450 includes the package substrate 400 below a die 452. As noted above, in reference to FIG. 4A, the package substrate 400 includes the dielectric layers 402*a-c* and the metal layers 404*a-c*. The dielectric layers 402*a-c* may include one or more different dielectric materials (e.g., dielectric material # 1 (406*a-z*) and dielectric material # 2 (408*a-z*)). The die 452 may be surrounded by an encapsulation layer 456 (e.g., mold). The die 452 may include an active side 454 that includes logic components (e.g., CPU, GPU, routing device (not shown)) and interconnections. Furthermore, the die 452 may be coupled to the package substrate 400, with the active side 454 of the die 452 coupled to the dielectric layer 402*a* of the package substrate 400, for example.

In some aspects, the second dielectric material (e.g., dielectric material # 2, 408*a-z*) in a dielectric layer (e.g., 402*a*) may be selected based on a logic component on the active side 454 of die 452. For example, where a logic component on the active side 454 of the die 452 is a routing device, the dielectric material # 2 (e.g., 408*a-z*) may be selected to have a lower Dk than the first dielectric material (e.g., 406*a-z*) to reduce signal loss.

Figure 5B:
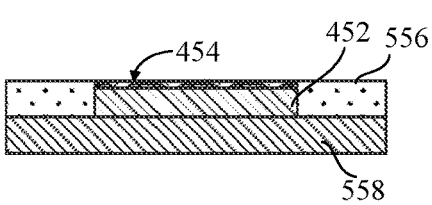
Figure 5B:
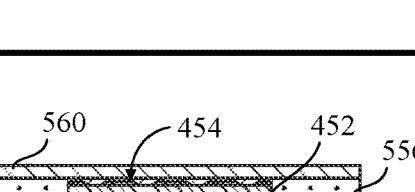
Figure 5B:
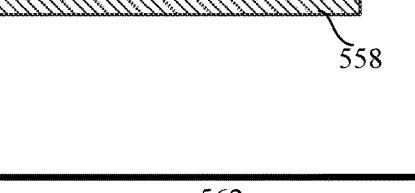
Figure 5B:
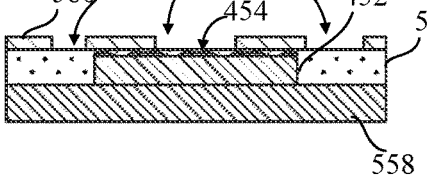
Figure 5C:
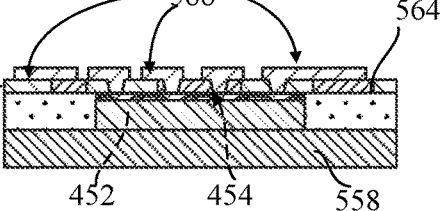
Figure 5C:
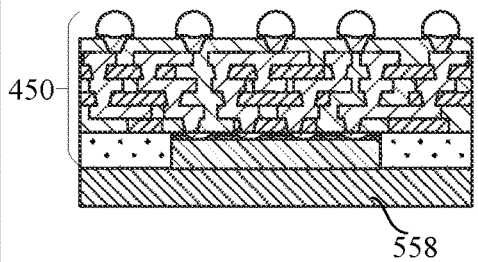
Figure 5C:
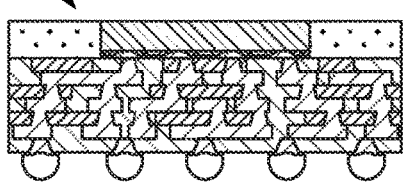

FIGS. 5A-C are diagrams illustrating a process 500 for forming an integrated circuit package such as the integrated circuit package 450 of FIG. 4B, in accordance with aspects of the present disclosure. At block 502, a first carrier or carrier plate 550 is provided. The first carrier 550 may be a substrate such as glass, silicon (Si), or a ceramic, for example.

At block 504, a temporary bonding film coating 552 may be applied to the first carrier 550. The temporary bonding film 552 may be an adhesive coating and may be applied to a top surface of the first carrier 550 to attach a die to the first carrier 550.

At block 506, a die (e.g., die 452) may be placed on a temporary bonding film coating 552. The die 452 may be placed with the active side 454 of the die 452 facing downward and coupled to the top surface of the first carrier 550. The active side 454 of the die 452 may include logic elements and interconnections between such logic elements or components. In some aspects, the logic elements or components (e.g., transistors) may be fabricated via a front end of line (FEOL) process and the interconnections may be fabricated via a back-end-of-line (BEOL) process.

At block 508, the die 452 may be encapsulated with an encapsulation material 556. That is, the encapsulation material 556 may be applied to substantially surround the die 452. In some aspects, the encapsulation material 556 may be an epoxy, a mold, or other encapsulating material. In one example, a mold may be applied over the first carrier 550 and the die 452 to encapsulate the die.

At block 510, the encapsulation material 556 may be ground back to a desired height. For example, the encapsulation material 556 may be ground to a thickness of the die.

Referring to FIG. 5B, the process 500 continues and at block 512, a second carrier 558 may be attached to a top side (back side) of the die 452. The first carrier 550 (not shown) may be removed. The second carrier 558 may be a substrate, silicon (Si), glass, or a ceramic. Additionally, the assembly including the die 452, the encapsulation material 556, and the second carrier 558 may be flipped such that die 452 is positioned on top of the second carrier and the active side 454 of the die 452 including logic elements (e.g., logic pads) faces upward.

At block 514, a photoimageable dielectric (PID) coating 560 may be applied to laminate the upper surface (e.g., above the active side 454 of the die 452). In some aspects, the PID coating 560 may include a photosensitive liquid. Additionally, in some aspects, no filler is included with the PID coating 560. At block 516, a photo lithographic process may be performed such that the PID coating 560 may be exposed to a pattern of light (e.g., ultraviolet (UV) light). The exposure to light may cause some of the PID coating 560 to be removed or developed. The remaining PID coating 560 may be cured (e.g., baked) leaving in place a first dielectric material. This photo lithographic process may produce one or more openings 562 above the encapsulation material 556 and the active side 454 of the die 452. Additionally a pretreatment for adhesion may be applied. In some aspects, a plasma etch may be used to produce the openings 562.

At block 518 a second dielectric 564 may be applied to fill the openings 562. In some aspects, the second dielectric 564 may be applied by screen printing. A filler may be included for dielectric enhancement. The second dielectric 564 is different than the first dielectric (e.g., PID coating 560) and may have a higher or lower dielectric constant than the first dielectric according to a specific application (e.g., routing).

Referring to FIG. 5C, the process continues, and at block 520 a redistribution layer (RDL) buildup process may be performed. The RDL buildup process may include the application of a passivation material, which may be a dielectric, a mold or an epoxy. Additionally, a metal 566 may be deposited to form a metal conductive layer and interconnections.

At block 522, the process returns to block 514 to repeat the process at block 514 through 520 to produce additional layers of the package dielectric layers and conductive layers in an RDL buildup with multiple different dielectrics in each of the dielectric layers according to design preference. After the additional layers have been built up, an under bump metallization (UBM) layer (e.g., 412) may be formed. Additionally solder balls or package pin connections (e.g., 414a-e) may be attached to the UBM layer. At block 524, the carrier may be removed and the package may be singulated (e.g., cut), for example, when multiple packages are concurrently produced (e.g., fabricated) on a wafer. In such case, the wafer may be cut to separate the packages (e.g., 450) into individual packages. The package (e.g., 450) may in turn be coupled to a printed circuit board, as shown for example, in FIG. 2.

Although, the process 500 has described an RDL buildup process, this is merely exemplary, and other processes may also be employed for fabricating the package substrate 400 shown in FIG. 4A. For example, in some aspects, the package substrate (e.g., 400) may be produced via a prepreg process.

Figure 6:
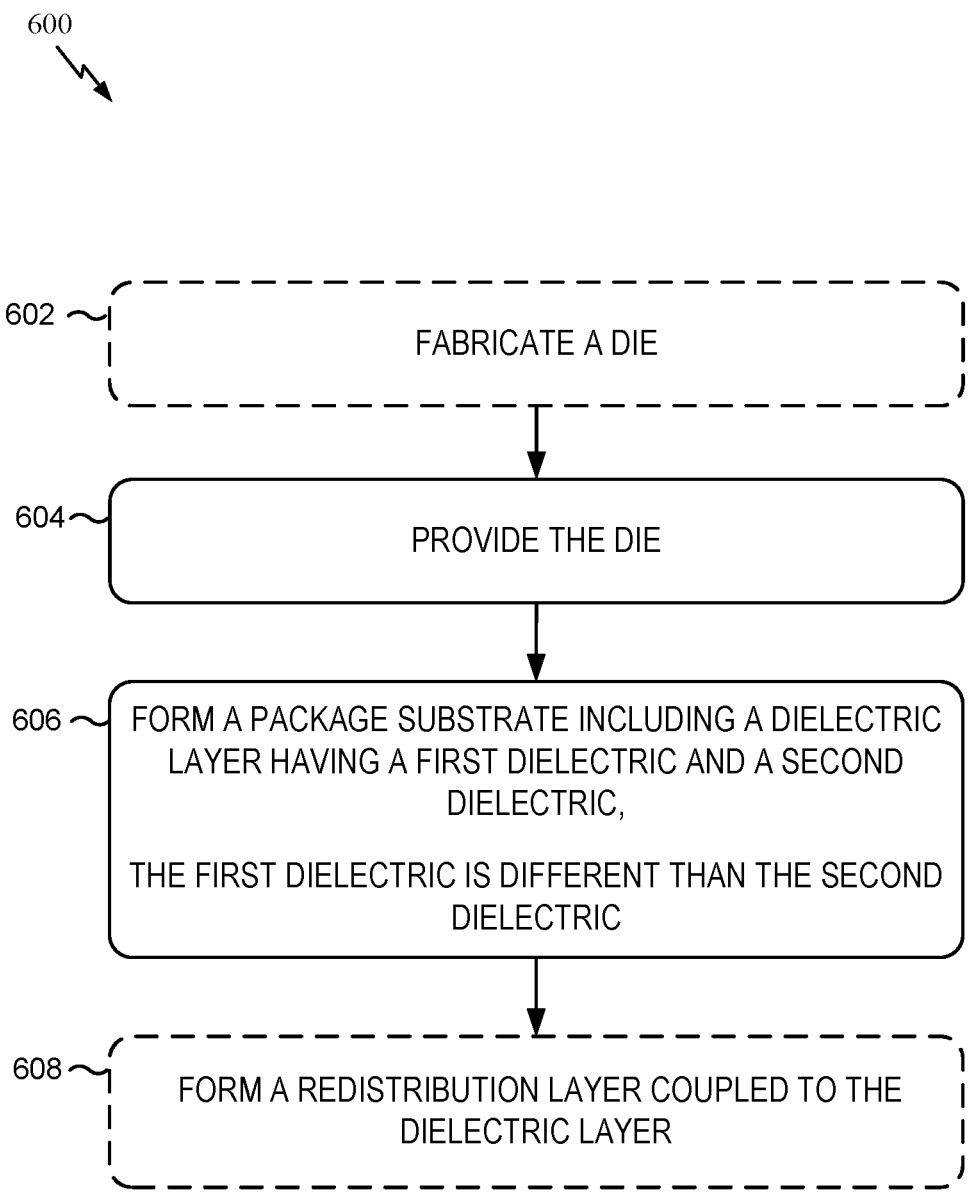
FIG. 6 is a flow diagram illustrating a process for producing a device package substrate, in accordance with aspects of the present disclosure.

FIG. 6 is a flow diagram 600 illustrating a process for producing a device (e.g., package substrate 400), in accordance with aspects of the present disclosure. Referring to FIG. 6, the process may, at block 602, optionally fabricate a die including one or more logic elements on an active side of the die. The logic elements may include devices such as a CPU or GPU, for example. The logic devices may be fabricated via FEOL processing with interconnections between such logic devices being produced via BEOL processing. At block 604, the process may provide the die. For example, as shown in FIG. 5A, in block 502, a die is provided on a first carrier 550.

At block 606, a package substrate is formed. The package substrate may be coupled to the active side of the die. The package substrate includes a dielectric layer having a first dielectric and a second dielectric. The first dielectric is different than the second dielectric. For instance, as shown in FIG. 5B, at block 514, a photoimageable dielectric (PID) coating 560 may be applied to laminate the upper surface (e.g., above the active side 454 of the die 452). In some aspects, the PID coating 560 may include a photosensitive liquid. Additionally, in some aspects, no filler (e.g., ultrafine glass particles) is included with the PID coating 560. At block 516, a photo lithographic process may be performed such that the PID coating 560 may be exposed to a pattern of light (e.g., ultraviolet (UV) light). The exposure to light may cause some of the PID coating 560 to be removed or developed. The remaining PID coating 560 may be cured (e.g., baked) leaving in place a first dielectric material. This photo lithographic process may produce one or more openings 562 above the encapsulation material 556 and the active side 454 of the die (e.g., 452). Additionally a pretreatment for adhesion may be applied. In some aspects, a plasma etch may produce the openings 562.

Further, at block 518 of FIG. 5B, a second dielectric 564 may fill the openings (562). In some aspects, the second dielectric 564 may be applied by screen printing. A filler may be included for dielectric enhancement. The second dielectric 564 is different than the first dielectric (e.g., PID coating 560) and may have a higher or lower dielectric constant than the first dielectric.

At block 608, the process optionally forms a redistribution layer coupled to the dielectric layer. Referring to FIG. 5C, a RDL buildup process may form a metal conductive layer and interconnections. Thereafter, the process may repeat the process steps at 514 through 520 to produce additional layers of the package dielectric layers and metal conductive layers in an RDL buildup with multiple different dielectrics in each of the dielectric layers according to design preference.

Figure 7:
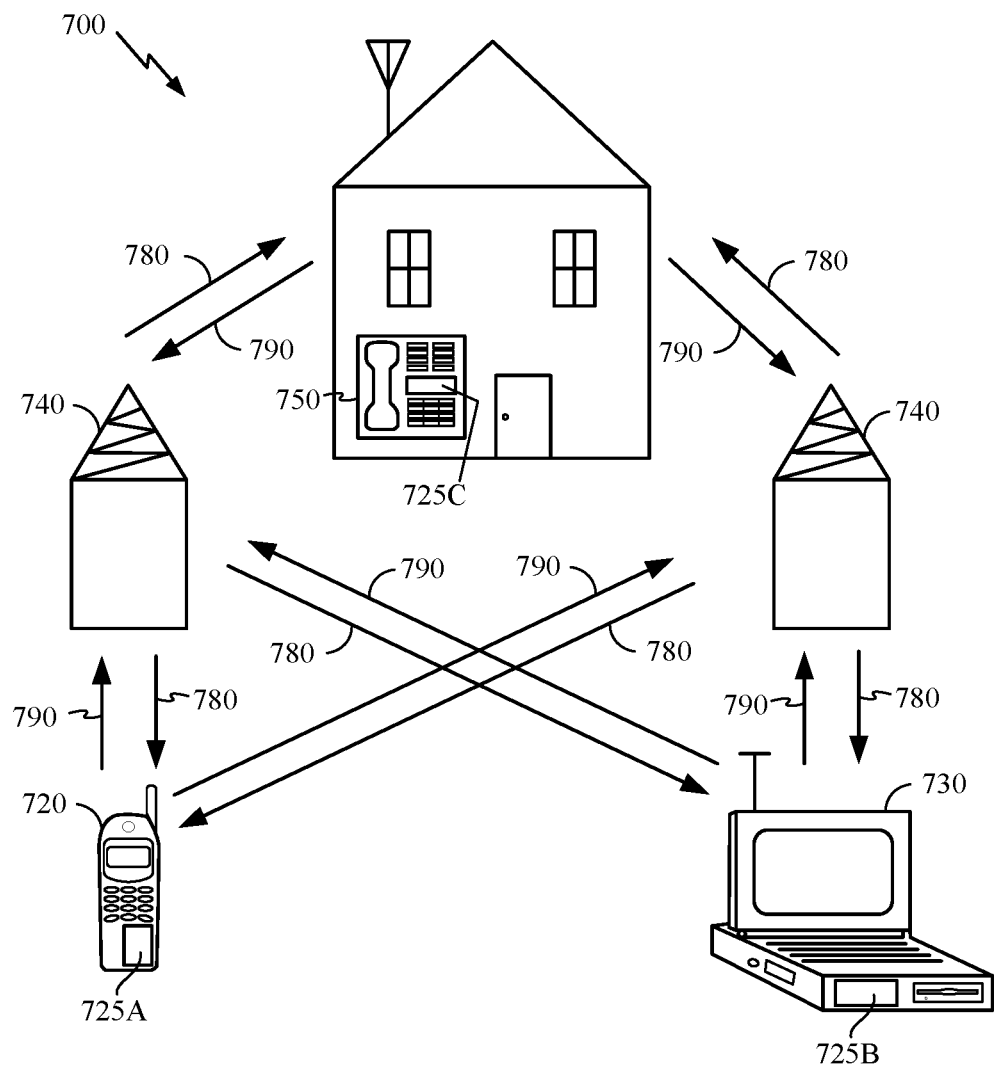
FIG. 7 is a block diagram showing an exemplary wireless communications system, in which an aspect of the present disclosure may be advantageously employed.

FIG. 7 is a block diagram showing an exemplary wireless communications system 700, in which an aspect of the present disclosure may be advantageously employed. For purposes of illustration, FIG. 7 shows three remote units 720, 730, and 750, and two base stations 740. It will be recognized that wireless communications systems may have many more remote units and base stations. Remote units 720, 730, and 750 include semiconductor devices 725A, 725B, and 725C, that include a package substrate with multiple different dielectrics in a same layer (725A, 725B, or 725C). It will be recognized that any device containing a semiconductor device may also include the package substrate including multiple different dielectrics in a same layer as described in FIGS. 1-5, including the base stations, switching devices, and network equipment. FIG. 7 shows forward link signals 780 from the base stations 740 to the remote units 720, 730, and 750, and reverse link signals 790 from the remote units 720, 730, and 750 to the base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communications systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof Although FIG. 7 illustrates remote units according to the teachings of the disclosure, the disclosure is not limited to these exemplary illustrated units. Aspects of the present disclosure may be suitably employed in any device which includes a semiconductor device.

Figure 8:
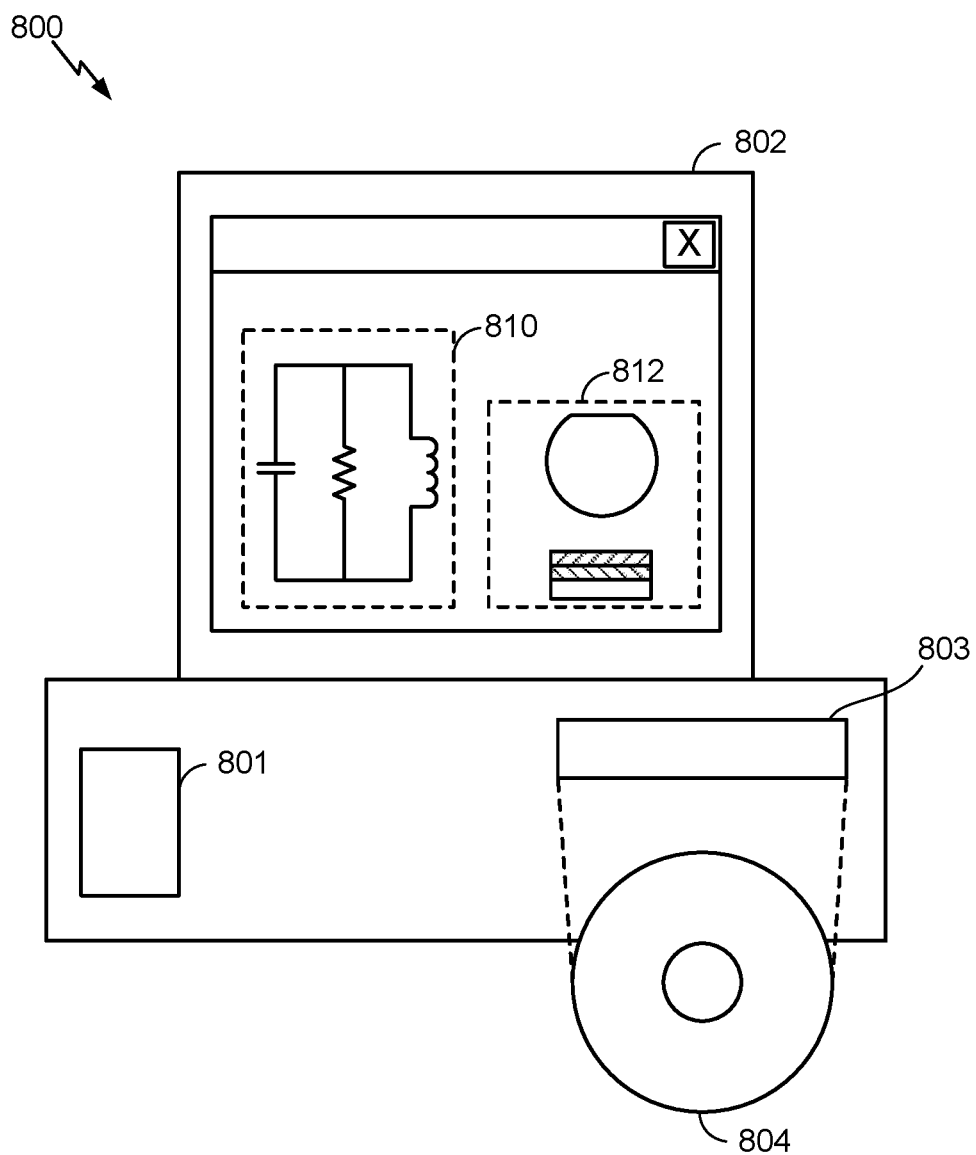
FIG. 8 is a block diagram illustrating a design workstation used for circuit, layout, and logic design of a semiconductor component, such as the capacitors disclosed above.

FIG. 8 is a block diagram illustrating a design workstation used for circuit, layout, and logic design of a semiconductor component, such as the capacitors disclosed above. A design workstation 800 includes a hard disk 801 containing operating system software, support files, and design software such as Cadence or OrCAD. The design workstation 800 also includes a display 802 to facilitate design of a circuit 810 or an integrated circuit (IC) component 812, such as a packaging layer with multiple different dielectric constants. A storage medium 804 is provided for tangibly storing the design of the circuit 810 or the IC component (e.g., the packaging layer with multiple different dielectric constants). The design of the circuit 810 or the IC component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit 810 or the IC component 812 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, nonvolatile, or other memory and is not limited to a particular type of memory or number of memories, or type of media upon which memory is stored.

For a firmware and/or software implementation of the design/fabrication process, the methodologies may be implemented with modules (e.g., procedures, functions, and so on) that perform the functions described. Any machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described may be utilized according to the present disclosure. Accordingly, the appended claims are intended to include within their scope such processes, machines, manufacture, compositions of matter, means, methods, or steps.

What is claimed is:

1. A package substrate comprising:
   at least one conductive layer; and
   a plurality of dielectric layers positioned in a different layer of the package substrate than each of the at least one conductive layer, each dielectric layer of the plurality of dielectric layers being alternately arranged with each of the at least one conductive layer and consisting of:
   at least one via;
   a first dielectric in first portions of each dielectric layer; and
   a second dielectric in second portions of each dielectric layer, the first portions and the second portions being arranged at alternating adjacent positions of each dielectric layer, the first dielectric having different physical properties than the second dielectric.

2. The package substrate of claim 1, in which the at least one conductive layer comprises multiple conductive layers, and the package substrate further includes one or more interconnections between the multiple conductive layers.

3. The package substrate of claim 1, in which a second dielectric constant of the second dielectric is greater than a first dielectric constant of the first dielectric.

4. The package substrate of claim 1, in which a second dielectric constant of the second dielectric is less than a first dielectric constant of the first dielectric.

5. An integrated circuit device, comprising:
   a die having one or more logic elements on an active side of the die; and
   a package substrate coupled to the die, the package substrate having: at least one conductive layer; and
   a plurality of dielectric layers positioned in a different layer of the package substrate than each of the at least one conductive layer, each dielectric layer of the plurality of dielectric layers being alternately arranged with each of the at least one conductive layer and consisting of:
   at least one via;
   a first dielectric in first portions of each dielectric layer; and
   a second dielectric in second portions of each dielectric layer, the first portions and the second portions arranged at alternating adjacent positions of each dielectric layer the first dielectric having different physical properties than the second dielectric.

6. The integrated circuit device of claim 5, including at least one redistribution layer.

7. The integrated circuit device of claim 5, in which the first dielectric has a first dielectric constant and the second dielectric has a second dielectric constant, the second dielectric constant being greater than the first dielectric constant.

8. The integrated circuit device of claim 5, in which the first dielectric has a first dielectric constant and the second dielectric has a second dielectric constant, the second dielectric constant being less than the first dielectric constant.

9. The integrated circuit device of claim 5, incorporated into at least one of a smartphone, a music player, a video player, an entertainment unit, a navigation device, a communications device, a personal digital assistant (PDA), a fixed location data unit, or a computer.

10. The integrated circuit device of claim 5, in which one or more openings are formed in the first dielectric and the second dielectric is applied to fill the one or more openings.

11. A method of providing a device, comprising:
providing a die having a logic element on an active side of the die;
forming a package substrate coupled to the active side of the die, the package substrate having at least one conductive layer, and a plurality of dielectric layers positioned in a different layer of the package substrate than each of the at least one conductive layer, each dielectric layer of the plurality of dielectric layers being alternately arranged with each of the at least one conductive layer and consisting of:
at least one via;
a first dielectric in first portions of the at least one dielectric layer; and
a second dielectric in second portions of the at least one dielectric layer, the first portions and the second portions arranged at alternating adjacent positions of each dielectric layer, the first dielectric having different physical properties than the second dielectric.

12. The method of claim 11, further comprising coupling at least one redistribution layer to a first dielectric layer of the plurality of dielectric layers.

13. The method of claim 11, further comprising forming the first dielectric using a photoimageable dielectric (PID).

14. The method of claim 13, further comprising:
applying the PID to the active side of the die; and
exposing the PID to form one or more openings in the PID.

15. The method of claim 14, further comprising forming the second dielectric via a screen printing process, the second dielectric filling the one or more openings in the PID.

16. The method of claim 11, further comprising selecting the second dielectric based on a logic component on the active side of the die.

17. The method of claim 11, further comprising incorporating the device into at least one of a smartphone, a music player, a video player, an entertainment unit, a navigation device, a communications device, a personal digital assistant (PDA), a fixed location data unit, or a computer.

18. The method of claim 11, further comprising:
forming one or more openings in the first dielectric; and
applying the second dielectric to fill the one or more openings in the first dielectric.

19. The method of claim 11, in which a second dielectric constant of the second dielectric is greater than a first dielectric constant of the first dielectric.

20. The method of claim 11, in which a second dielectric constant of the second dielectric is less than a first dielectric constant of the first dielectric.

* * * * *